(12) United States Patent
Xu et al.

(10) Patent No.: US 6,992,365 B2
(45) Date of Patent: Jan. 31, 2006

(54) REDUCING LEAKAGE CURRENTS IN MEMORIES WITH PHASE-CHANGE MATERIAL

(75) Inventors: Daniel Xu, Mountain View, CA (US); Tyler A. Lowery, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 534 days.

(21) Appl. No.: 09/976,641

(22) Filed: Oct. 12, 2001

(65) Prior Publication Data

US 2003/0073262 A1 Apr. 17, 2003

(51) Int. Cl.
*H01L 29/12* (2006.01)

(52) U.S. Cl. .................. 257/529; 257/910; 257/2

(58) Field of Classification Search ........... 257/910, 257/529, 2
See application file for complete search history.

(56) References Cited

U.S. PATENT DOCUMENTS

| | | | | |
|---|---|---|---|---|
| 4,203,123 A | * | 5/1980 | Shanks | 357/2 |
| 4,599,705 A | * | 7/1986 | Holmberg et al. | 365/163 |
| 5,359,205 A | * | 10/1994 | Ovshinsky | 257/3 |
| 5,502,326 A | * | 3/1996 | Slotboom et al. | 257/530 |
| 6,015,995 A | * | 1/2000 | Chang | 257/390 |

FOREIGN PATENT DOCUMENTS

JP 53-132281 * 11/1978

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

(Continued)

*Primary Examiner*—Jerome Jackson
(74) *Attorney, Agent, or Firm*—Trop, Pruner & Hu, P.C.

(57) ABSTRACT

A memory cell including a phase-change material may have reduced leakage current. The cell may receive signals through a buried wordline in one embodiment. The buried wordline may include a sandwich of a more lightly doped N type region over a more heavily doped N type region over a less heavily doped N type region. As a result of the configuration of the N type regions forming the buried wordline, the leakage current of the buried wordline to the substrate under reverse bias conditions may be significantly reduced.

19 Claims, 4 Drawing Sheets

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

* cited by examiner

1

REDUCING LEAKAGE CURRENTS IN MEMORIES WITH PHASE-CHANGE MATERIAL

BACKGROUND

This invention relates generally to memories that use phase-change materials.

Phase-change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure and the crystalline state involves a more ordered atomic structure. Generally, any phase-change material may be utilized; however, in some embodiments, thin-film chalcogenide alloy materials may be particularly suitable.

The phase-change may be induced reversibly. Therefore, the memory may change from the amorphous to the crystalline state and may revert back to the amorphous state thereafter or vice versa. In effect, each memory cell may be thought of as a programmable resistor, which reversibly changes between higher and lower resistance states.

In some situations, the cell may have a large number of states. That is, because each state may be distinguished by its resistance, a number of resistance determined states may be possible allowing the storage of multiple bits of data in a single cell.

A variety of phase-change alloys are known. Generally, chalcogenide alloys contain one or more elements from column VI of the periodic table. One particularly suitable group of alloys are GeSbTe alloys.

A phase-change material may be formed within a passage or pore defined through a dielectric material. A phase-change material may be sandwiched between lower and upper electrodes.

A buried wordline structure may be utilized to provide signals to the lower electrode of a phase-change material memory cell. These signals may include programming signals to change the programming state of the cell or read signals to read the current state of the phase-change material.

A buried wordline may form a diode in a substrate under the lower electrode. The diode necessarily has a certain reverse bias leakage current to the substrate. In particular, the diode is formed of a P+ layer over an N+ layer over a P type substrate. When the N+ type layer is reverse biased between the N type layer and the substrate, an N+/N−/P− diode is formed whose reverse leakage current may be substantial.

Generally, the N+ layer must be relatively narrow resulting in higher wordline resistance. These structures may have relatively high resistance and at times may have substantial leakage currents.

Thus, there is a need for way to reduce the leakage currents of phase-change memory cells.

DETAILED DESCRIPTION

Figure 1:
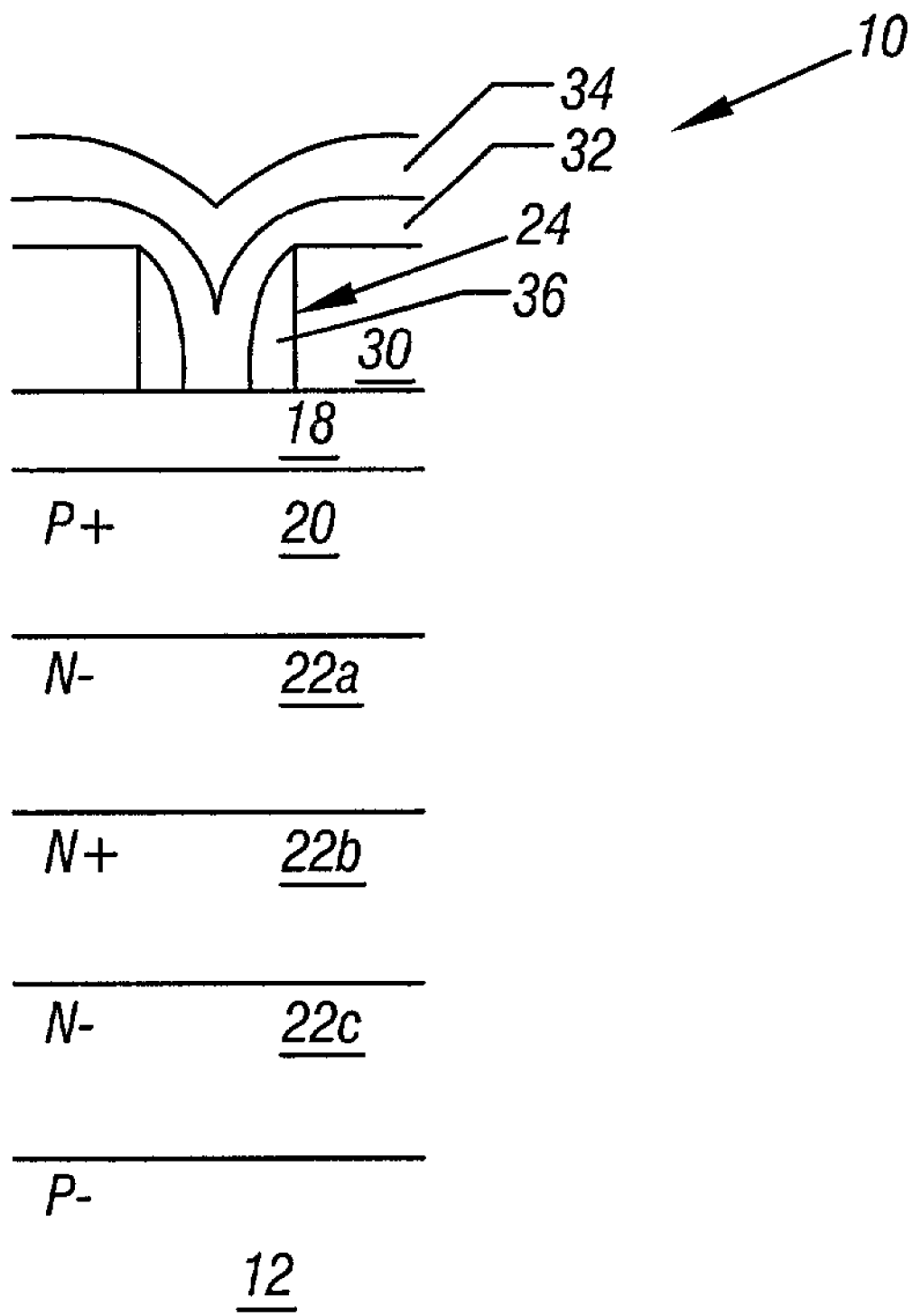
FIG. 1 is an enlarged cross-sectional view of a phase-change memory cell in accordance with one embodiment of the present invention.

Referring to FIG. 1, a phase-change memory cell 10 may include a phase-change material 32 formed in a pore 24. The pore 24 may include an etched aperture formed through a dielectric material 30. In some embodiments, the walls of the dielectric material 30 and the pore 24 may be defined by a cylindrically shaped sidewall spacer 36. Thus, in some embodiments, the phase-change material 32 may coat the walls of the pore 24 defined by the sidewall spacer 36 and may come in contact with the lower electrode 18. An upper electrode 34 may be defined over the phase-change material 32.

Signals may be applied through the lower electrode 18 to the phase-change material 32 and on to the upper electrode 34. These signals may include set and reset signals to change the programmed state of the phase-change material 32 as well as read signals to read the programmed state.

The signals are supplied to the lower electrode 18 through a buried wordline 22 in one embodiment. In accordance with one embodiment of the present invention, the buried wordline 22 includes a more lightly doped or an N− region 22a over a more heavily doped or N+ region 22b over a more lightly doped or N− region 22c. The substrate 12 may be more lightly doped or P− material and layer 20 may be more heavily doped or P+ material.

In accordance with some embodiments of the present invention, the configuration of the buried wordline 22 reduces leakage current under reverse bias conditions, thereby lowering the standby current needed for the memory cells 10. The lower buried wordline resistance may result in less voltage drop along the row lines, enhancing the programming operation efficiency and lowering the programming current in some embodiments. In addition, the resulting diode, made up of the layers 20 and 22, may have an increased Zener breakdown voltage.

Figure 2:
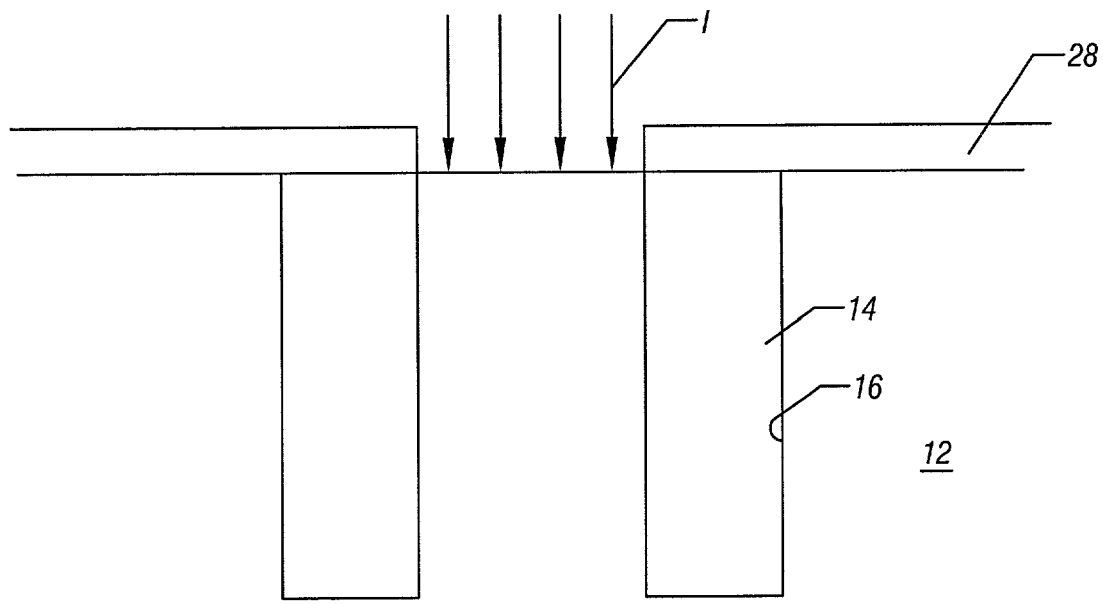
FIG. 2 is a cross-sectional view of the embodiment shown in FIG. 1 at an early fabrication stage.

Turning next to FIG. 2, the formation of the memory cell 10 may begin by forming a pair of spaced trenches 16 in the substrate 12. The trenches 16 may isolate one wordline from adjacent wordlines that make up a memory array. The trenches 16 may be filled with an oxide 14 in some embodiments. The region between the trenches 16 may then be subjected to a series of ion-implantation steps, indicated at I.

Figure 3:
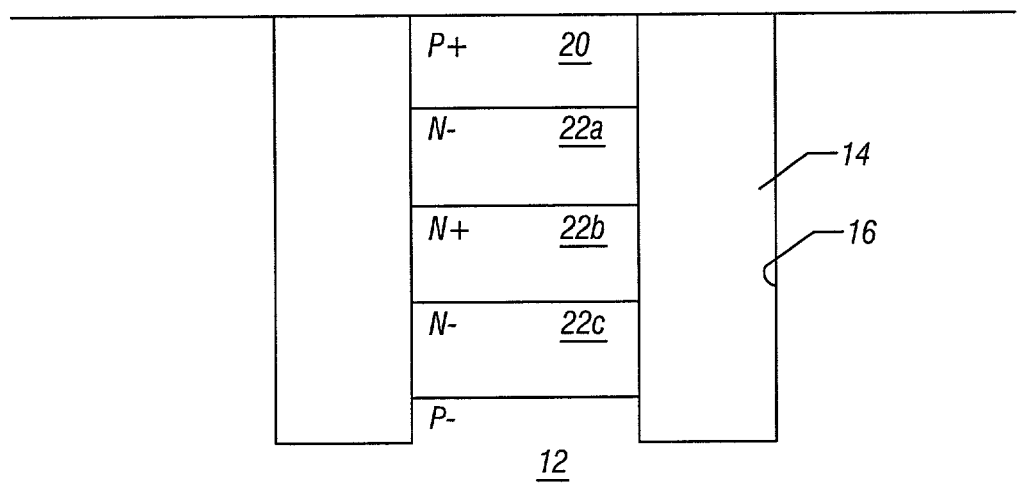
FIG. 3 is a cross-sectional view of the embodiment shown in FIG. 2 after further processing in accordance with one embodiment of the present invention.

As a result of a sequence ion-implantation steps, a diode formed of a P+ region 20 over an N type buried wordline 22 may be defined in a P− substrate 12. In particular, the energy, dose and doping profiles of a series of implants may be adjusted to achieve the sequence of layers 22a, 22b and 22c indicated in FIG. 3. That is, the concentration profile resulting from a plurality of implants may be selected so as to create the specied series of doped layers 22 by adjusting the depth of each implant's concentration profile.

While the exact nature of the ion-plantation steps may be subject to considerable variation, an initial implantation may be utilized to form a P type well. This may be followed by a P type and N type implant to form the buried wordline 22 and overlaying P+ region 20. These implants in turn may be followed by one or more additional implants, in some embodiments, to create the profiles indicated in FIG. 3. In some embodiments, the P type region may be formed by a boron implant and the N type region may be formed by a phosphorus implant.

Through the provision of the N− regions 22a and 22c, the reverse bias leakage current of the resulting cell 10 may be significantly improved in some embodiments. The implanted layers may be subjected to sufficient heat processing to achieve the desired performance.

Figure 4:
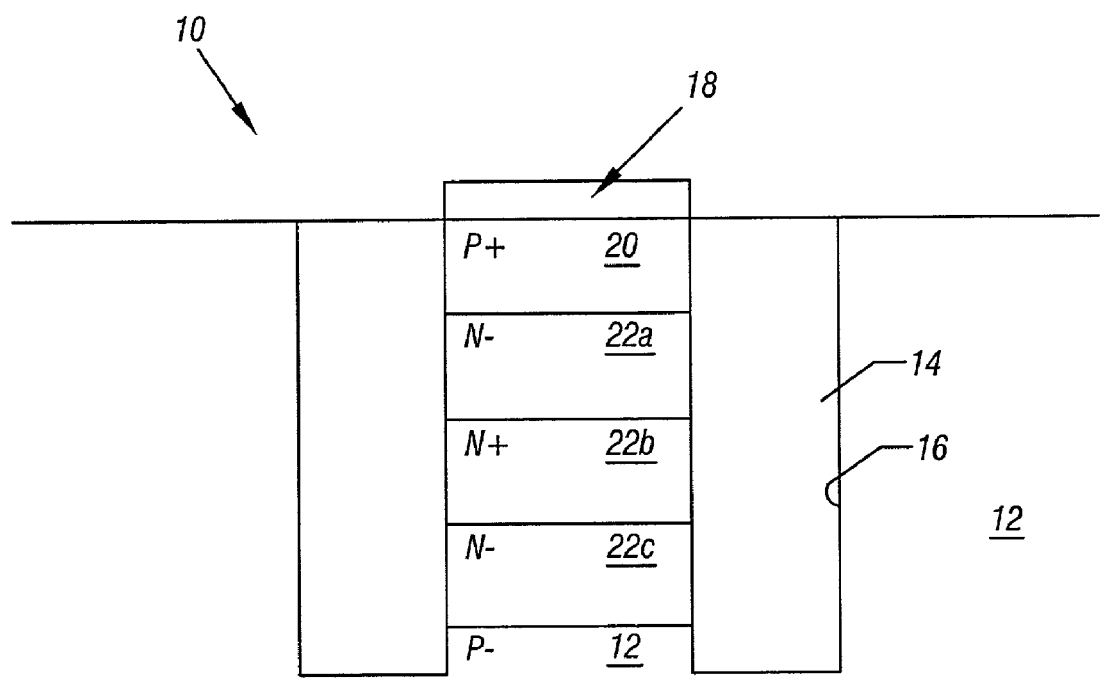
FIG. 4 is a cross-sectional view of the embodiment shown in FIG. 3 after still further processing in accordance with one embodiment of the present invention.

A lower electrode layer 18 may be formed over the layers 20 and 22 as shown in FIG. 4. In some embodiments, the lower electrode 18 may be formed of cobalt silicide. Thereafter, the cell 10 may be completed by defining the pore 24 and developing the structure shown in FIG. 1. Of course any of a variety of cell structures may be utilized in accordance with embodiments of the present invention.

Figure 5:
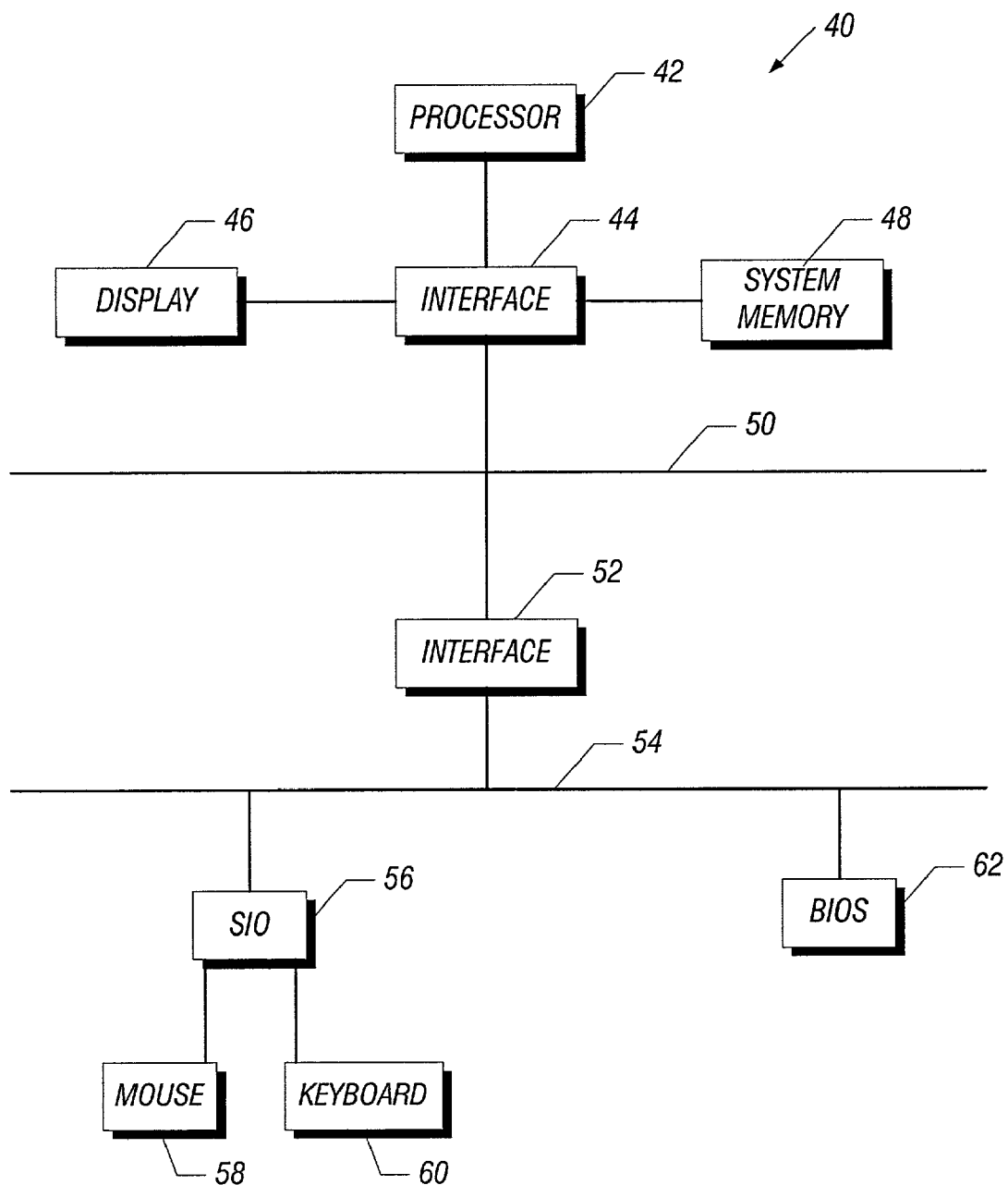
FIG. 5 is a schematic depiction of a processor-based system in accordance with one embodiment of the present invention.

Referring to FIG. 5, the memory cell 10 shown in FIG. 1 may be replicated to form a memory array including a large number of cells. That memory array may be utilized as the memory of a wide variety of processor-based systems such as the system 40 shown in FIG. 5. For example, the memory array may be utilized as the system memory or other memory in a variety of personal computer products such as laptop products, desktop products or servers. Similarly, the memory array may be utilized in a variety of processor-based appliances. Likewise, it may be used as memory in processor-based telephones including cellular telephones.

In general, the use of the phase-change memory may be advantageous in a number of embodiments in terms of lower cost and/or better performance. Referring to FIG. 5, the memory 48, formed according to the principles described herein, may act as a system memory. The memory 48 may be coupled to a interface 44, for instance, which in turn is coupled between a processor 42, a display 46 and a bus 50. The bus 50 in such an embodiment is coupled to an interface 52 that in turn is coupled to another bus 54.

The bus 54 may be coupled to a basic input/output system (BIOS) memory 62 and to a serial input/output (SIO) device 56. The device 56 may be coupled to a mouse 58 and a keyboard 60, for example. Of course, the architecture shown in FIG. 5 is only an example of a potential architecture that may include the memory 48 using the phase-change material.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory cell comprising:
   a substrate;
   a phase-change material over said substrate;
   a buried line of a first conductivity type formed in said substrate, said buried line including a more lightly doped region over a more heavily doped region and a more lightly doped region under said more heavily doped region;
   a region of a second conductivity type opposite said first conductivity type over said line and under said phase-change material; and
   a pair of trenches on either side of said buried line extending past said buried line and said region of a second conductivity type into said substrate under said buried line.

2. The memory cell of claim 1 including a dielectric material defining a pore over the substrate, said phase-change material being formed in said pore.

3. The memory cell of claim 2 including a contact layer under said dielectric layer aligned with said pore.

4. The memory cell of claim 3 wherein said lightly doped regions reduce the reverse bias leakage of said line.

5. The memory cell of claim 1 wherein said line is a wordline that couples to other memory cells.

6. The memory cell of claim 1 wherein said lightly doped regions are N-type material.

7. The memory cell of claim 6 wherein said lightly doped regions are N-regions.

8. The memory cell of claim 7 wherein said substrate is a P-type substrate.

9. The memory cell of claim 2 wherein said pore is lined with a sidewall spacer.

10. An electronic device comprising:
    a system memory circuit including:
      a substrate;
      a phase-change material over said substrate;
      a conductive line of a first conductivity type in said substrate, said line including a more heavily doped region sandwiched between more lightly doped regions, said conductive line providing signals to said phase-change material;
      a region of a second conductivity type between said phase-change material and said conductive line;
      a pair of trenches on either side of said buried line, said trenches extending through said substrate along said conductive line and said region of a second conductivity type into the substrate below said conductive line; and
    a processor coupled to said system memory circuit.

11. The device of claim 10 wherein said phase-change material forms a memory cell of a storage.

12. The device of claim 11 wherein said storage is part of a computer.

13. The device of claim 11 including a processor, an interface and a bus coupled to said storage.

14. The device of claim 11 wherein said conductive line is a buried wordline.

15. The device of claim 14 including a conductive material between said phase-change material and said conductive line.

16. The device of claim 15 wherein said conductive line is formed of a material having a first conductivity type, a material of a second conductivity type being defined in said surface over said conductive line.

17. The device of claim 16 wherein said more heavily doped region is an N+ region and said more lightly doped regions are N− regions.

18. The device of claim 10 wherein said surface includes a semiconductor substrate.

19. The device of claim 18 including an insulator material positioned over said surface and a pore being formed in said insulator material, said phase-change material being formed in said pore.

* * * * *